United States Patent
Kuo et al.

(10) Patent No.: US 10,439,575 B1
(45) Date of Patent: Oct. 8, 2019

(54) WIDEBAND DISTRIBUTED DIFFERENTIAL POWER AMPLIFIER UTILIZING METAMATERIAL TRANSMISSION LINE CONCEPTION WITH IMPEDANCE TRANSFORMATION

(71) Applicant: SPEEDLINK TECHNOLOGY INC., Cupertino, CA (US)

(72) Inventors: Che-Chun Kuo, Atlanta, GA (US); Taiyun Chi, Atlanta, GA (US); Thomas Chen, Atlanta, GA (US)

(73) Assignee: SPEEDLINK TECHNOLOGY INC., Cupertino, CA (US)

( * ) Notice: Subject to any disclaimer, the term of this patent is extended or adjusted under 35 U.S.C. 154(b) by 0 days.

(21) Appl. No.: 15/989,148

(22) Filed: May 24, 2018

(51) Int. Cl.
| | |
|---|---|
| H03F 3/45 | (2006.01) |
| H03F 3/195 | (2006.01) |
| H03F 3/213 | (2006.01) |
| H04W 84/04 | (2009.01) |

(52) U.S. Cl.
CPC ......... *H03F 3/45475* (2013.01); *H03F 3/195* (2013.01); *H03F 3/213* (2013.01); *H03F 2200/315* (2013.01); *H03F 2200/451* (2013.01); *H03F 2200/541* (2013.01); *H03F 2203/45034* (2013.01); *H03F 2203/45036* (2013.01); *H04W 84/042* (2013.01)

(58) Field of Classification Search
CPC ................................................. H03F 3/45475
See application file for complete search history.

(56) References Cited

U.S. PATENT DOCUMENTS

| | | | | |
|---|---|---|---|---|
| 5,406,471 | A | * | 4/1995 | Yamanaka .......... H02M 1/4225 323/222 |
| 6,400,580 | B1 | * | 6/2002 | Bowman ............... H02M 3/337 363/132 |
| 9,413,309 | B1 | * | 8/2016 | Zhao ....................... H03F 3/193 |
| 2010/0158084 | A1 | * | 6/2010 | Voinigescu .......... H03B 5/1847 375/219 |
| 2011/0215865 | A1 | * | 9/2011 | Nam ........................ H03F 3/68 330/124 R |
| 2013/0113300 | A1 | * | 5/2013 | Zybura .................... H03H 7/42 307/105 |
| 2014/0070884 | A1 | * | 3/2014 | Gramegna .............. H03F 1/565 330/144 |
| 2017/0149394 | A1 | * | 5/2017 | Kao ......................... H03F 3/19 |
| 2019/0013780 | A1 | * | 1/2019 | Amiot ...................... H03F 3/26 |

* cited by examiner

*Primary Examiner* — Patricia T Nguyen
(74) *Attorney, Agent, or Firm* — Womble Bond Dickinson (US) LLP (57) ABSTRACT

According to one embodiment, a differential power amplifier includes a pair of transistors, a transformer coupled to the drain terminals of the transistors, and an output transmission line. The differential power amplifier operates in a range of frequencies from a lower operating frequency to an upper operating frequency to provide a relatively linear gain between the lower operating frequency and the higher operating frequency. The drains of the transistors are coupled to the primary winding of the transformer. The output transmission line is coupled to the secondary winding of the transformer. The output transmission line further includes at least one inductor-capacitor (LC) circuit that is configured to match predetermined output impedance in view of the lower and upper operating frequencies of the differential power amplifier.

16 Claims, 11 Drawing Sheets

WIDEBAND DISTRIBUTED DIFFERENTIAL POWER AMPLIFIER UTILIZING METAMATERIAL TRANSMISSION LINE CONCEPTION WITH IMPEDANCE TRANSFORMATION

FIELD OF THE DISCLOSURE

Embodiments of the present invention relate generally to power amplifier circuit for radio frequency (RF) circuit. More particularly, embodiments of the invention relate to a distributed differential power amplifier circuit using metamaterial transmission line and impedance transformation.

BACKGROUND

Facing to human's information society in the future, related technology of 5G (fifth generation) has not reached a stable standard, but the basic features of 5G are clear, such as high speed, low latency, mass devices connection, low power consumption. 5G terminal antenna is the main component of 5G terminals. Unless we innovatively defeat the technology difficulty of antenna design can we ensure a normal run and commercial use of a 5G system.

As a result, a power amplifier has to operate in a wide range of operating frequencies. Due to the high frequency and a wideband of frequencies, the design of the power amplifier, particular, in an integrated circuit (IC) is challenging.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to one aspect of the invention, a power amplifier includes a transistor operating in a range of frequencies from a lower operating frequency to a higher operating frequency to provide a relatively linear gain between the lower operating frequency and the higher operating frequency, an input metamaterial transmission line coupled to a gate terminal of the transistor, and an output metamaterial transmission line coupled to a drain terminal of the transistor. The input metamaterial transmission line includes a first inductor-capacitor (LC) circuit that resonates at a first resonant frequency equaled to or higher than the higher operating frequency. The output metamaterial transmission line includes a second LC circuit and a third LC circuit. The second LC circuit resonates at a second resonant frequency equaled to or lower than the lower operating frequency. The third LC circuit resonates at a third resonant frequency equaled to or higher than the higher operating frequency. The power amplifier can be utilized in a wideband radio frequency (RF) circuit.

In one embodiment, the first LC circuit represents a right-hand (LH) transmission line. The second LC circuit represents a left-hand (LH) transmission line. The third LC circuit represents a RH transmission line. The second LC circuit and the third LC circuit form a composite transmission line. The second LC circuit is an LCL circuit and the third LC circuit is a CLC circuit. The "C" component of the LCL circuit is coupled to the "L" component of the CLC circuit in series, while the "L" components of the LCL circuit are coupled to the "C" components of the CLC circuit in parallel.

According to another aspect of the invention, a differential power amplifier includes a pair of transistors, a transformer coupled to the drain terminals of the transistors, and an output transmission line. The differential power amplifier operates in a range of frequencies from a lower operating frequency to an upper operating frequency to provide a relatively linear gain between the lower operating frequency and the higher operating frequency. The drains of the transistors are coupled to the primary winding of the transformer. The output transmission line is coupled to the secondary winding of the transformer. The output transmission line further includes at least one inductor-capacitor (LC) circuit that is configured to match predetermined output impedance in view of the lower and upper operating frequencies of the differential power amplifier.

According to one embodiment, a differential power amplifier operating within a range of operating frequencies from a lower frequency ($f_1$) to an upper frequency ($f_2$) includes a pair of a first transistor and a second transistor coupled to each other to form a differential amplifier, a transformer, and an output transmission line. The transformer is coupled between the transistors and the output transmission line. The transformer includes a primary winding coupled to the transistors and a secondary winding coupled to the output transmission line with a predetermined turn ratio (n) and a coupling coefficient (k).

In one embodiment, the output transmission line includes a first inductor and a second inductor having an identical inductance ($L_1$) coupled in series to a first terminal and a second terminal of the secondary winding of the transformer. The output transmission line further includes a third inductor, a first capacitor, a fourth inductor, and a second capacitor. The third inductor is coupled to the first terminal of the secondary winding of the transformer. The second inductor is configured to have an inductance ($L_{1\_1}$) that is determined based on $L_1$, n, and k. The first capacitor is coupled to the third inductor in series and a first output terminal of the differential power amplifier, where the first capacitor has a capacitance of $C_2$. The fourth inductor is coupled to the second terminal of the secondary winding of the transformer. The fourth inductor is configured to have an inductance ($L_{1\_1}$) that is determined based on $L_1$, n, and k. The second capacitor is coupled to the fourth inductor in series and a second output terminal of the amplifier, where the second capacitor has a capacitance value of $C_2$.

Figure 1:
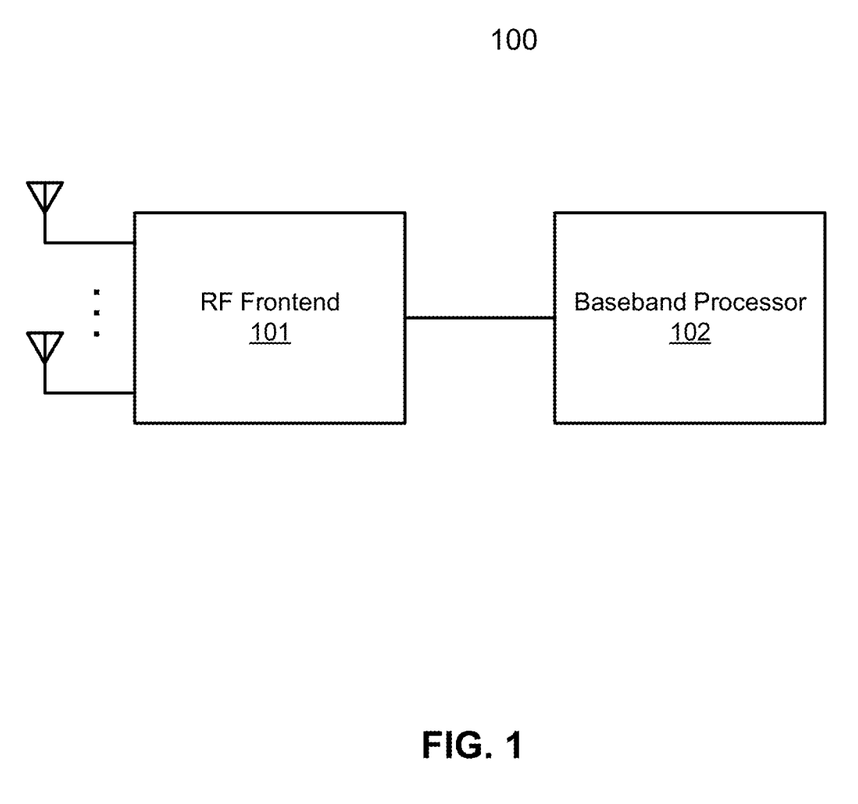
FIG. 1 is a block diagram illustrating an example of a wireless communication device according one embodiment of the invention.

FIG. 1 is a block diagram illustrating an example of a wireless communication device according to one embodiment of the invention. Referring to FIG. 1, wireless communication device 100 (also simply referred to as a wireless device) includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc. Wireless communication device 100 may be a CPE device.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise down-converter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes an array of RF transceivers, where each of the RF transceivers transmits and receives RF signals within a particular frequency band (e.g., a particular range of frequencies such as non-overlapped frequency ranges) via one of a number of RF antennas. The RF frontend integrated circuit (IC) chip further includes a full-band frequency synthesizer coupled to the RF transceivers. The full-based frequency synthesizer generates and provides a local oscillator (LO) signal to each of the RF transceivers to enable the RF transceiver to mix, modulate, and/or demodulate RF signals within a corresponding frequency band. The array of RF transceivers and the full-band frequency synthesizer may be integrated within a single IC chip as a single RF frontend IC chip or package.

Figure 2:
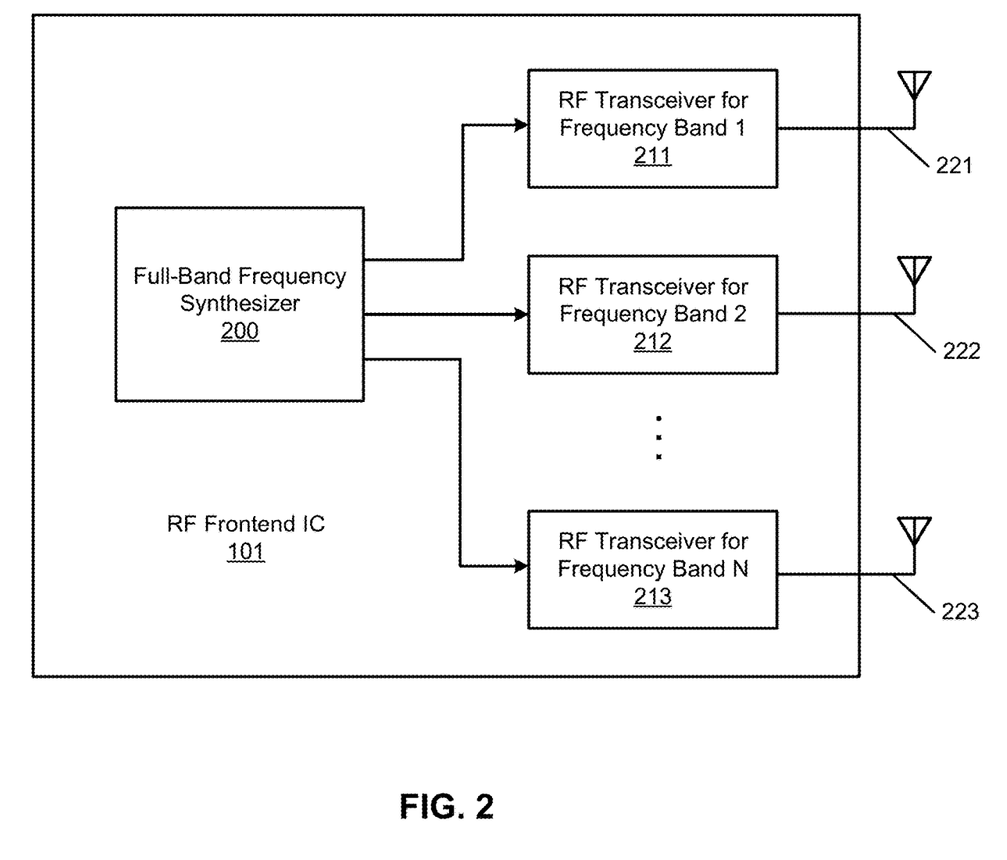
FIG. 2 is a block diagram illustrating an example of an RF frontend integrated circuit according to one embodiment of the invention.

FIG. 2 is a block diagram illustrating an example of an RF frontend integrated circuit according to one embodiment of the invention. Referring to FIG. 2, RF frontend 101 includes, amongst others, a full-base frequency synthesizer 200 coupled to an array of RF transceivers 211-213. Each of transceivers 211-213 is configured to transmit and receive RF signals within a particular frequency band or a particular range of RF frequencies via one of RF antennas 221-223. In one embodiment, each of transceivers 211-213 is configured to receive a LO signal from full-band frequency synthesizer 200. The LO signal is generated for the corresponding frequency band. The LO signal is utilized to mix, modulate, demodulated by the transceiver for the purpose of transmitting and receiving RF signals within the corresponding frequency band.

Figure 3:
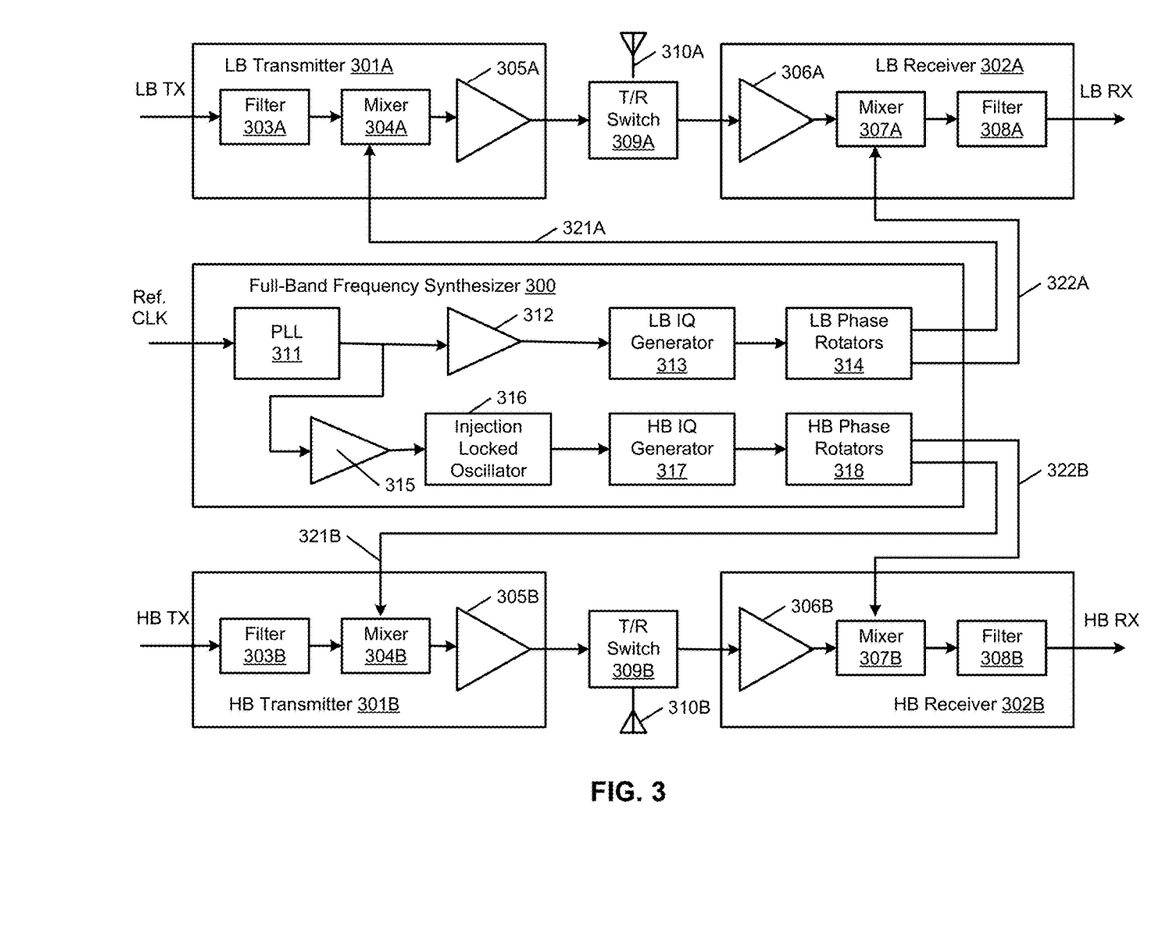
FIG. 3 is a block diagram illustrating an RF frontend integrated circuit according to another embodiment of the invention.

FIG. 3 is a block diagram illustrating an RF frontend integrated circuit according to another embodiment of the invention. Referring to FIG. 3, full-band frequency synthesizer 300 may represent full-band frequency synthesizer 101 as described above. In one embodiment, full-band frequency synthesizer 300 is communicatively coupled to an array of transceivers, each transceiver corresponding to one of a number of frequency bands. In this example, full-band frequency synthesizer 300 is coupled to transmitter 301A, receiver 302A, transmitter 301B, and receiver 302B. Transmitter 301A and receiver 302A may be a part of a first transceiver operating in a lower frequency band, referred to as a low-band (LB) transmitter and LB receiver. Transmitter 301B and receiver 302B may be a part of a second transceiver operating in a higher frequency band, referred to as a high-band (HB) transmitter and HB receiver. Note that although there are only two transceivers as shown in FIG. 3, more transceivers may also be coupled to full-band frequency synthesizer 300 as shown in FIG. 2.

In one embodiment, frequency synthesizer 300 includes, but is not limited to, phase-lock loop (PLL) circuitry or block 311, a LO buffer 312, LB in-phase/quadrature (IQ) generator 313, and LB phase rotators 314. A PLL is a control system that generates an output signal whose phase is related to the phase of an input signal. While there are several differing types, it is easy to initially visualize as an electronic circuit consisting of a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop.

Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis. Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors.

Referring back to FIG. 3, PLL block 311 is to receive a clock reference signal and to lock onto the frequency of the clock reference signal to generate a first LO signal, i.e., a low-band LO signal or LBLO signal. The first LO signal may be optionally buffered by a LO buffer 312. Based on the LBLO signal, LB IQ generator 313 generates IQ signals that are suitable for mixing, modulating, and demodulating in-phase and quadrature components of RF signals. The IQ signals may be rotated by a predetermined angle or delayed by LB phase rotators 314. The rotated IQ signals are then provided to LB transmitter 301A and receiver 302A. Particularly, the IQ signals may include transmitting IQ (TXIQ)

signals 321A to be provided to LB transmitter 301A and in-phase and quadrature receiving IQ (RXIQ) signals 322A to be provided to LB receiver 302A.

In one embodiment, frequency synthesizer 300 further includes a frequency converter 315, injection locked oscillator 316, HB IQ generator 317, and HB phase rotators 318. Frequency converter 315 is to convert the first LO signal generated from the PLL block 311 to a signal with higher frequency (e.g., within a higher frequency band). In one embodiment, frequency converter 315 includes a frequency doubler to double the frequency of the first LO signal. Injection locked oscillator 316 is to lock onto the doubled-frequency signal received from frequency converter 315 to generator the second LO signal having the second LO frequency approximately twice as the first LO frequency. Note that in this example, the second LO frequency is twice as the first LO frequency. However, frequency converter 315 can convert and generate a frequency in any frequency range. If there are more frequency bands to be integrated within the RF frontend device, more frequency converters may be utilized to convert a reference frequency to a number of other lower or higher frequencies.

Injection locking and injection pulling are the frequency effects that can occur when a harmonic oscillator is disturbed by a second oscillator operating at a nearby frequency. When the coupling is strong enough and the frequencies near enough, the second oscillator can capture the first oscillator, causing it to have essentially identical frequency as the second. This is injection locking. When the second oscillator merely disturbs the first but does not capture it, the effect is called injection pulling. Injection locking and pulling effects are observed in numerous types of physical systems, however the terms are most often associated with electronic oscillators or laser resonators.

Referring back to FIG. 3, HB IQ generator 317 generates IQ signals that are suitable for mixing, modulating, and demodulating in-phase and quadrature components of RF signals in a high band frequency range. In electrical engineering, a sinusoid with angle modulation can be decomposed into, or synthesized from, two amplitude-modulated sinusoids that are offset in phase by one-quarter cycle ($\pi/2$ radians). All three functions have the same frequency. The amplitude modulated sinusoids are known as in-phase and quadrature components. Some people find it more convenient to refer to only the amplitude modulation (baseband) itself by those terms.

The IQ signals may be rotated by a predetermined angle or delayed by HB phase rotators 318. The rotated IQ signals are then provided to HB transmitter 301B and receiver 302B. Particularly, the IQ signals may include transmitting IQ (TXIQ) signals 321B to be provided to HB transmitter 301B and in-phase and quadrature receiving IQ (RXIQ) signals 322B to be provided to HB receiver 302B. Thus, components 312-314 are configured to generate TXIQ and RXIQ signals for LB transmitter 301A and LB receiver 302A, while components 315-318 are configured to generate TXIQ and RXIQ signals for HB transmitter 301B and HB receiver 302B. If there are more transmitters and receivers of more frequency bands involved, more sets of components 312-314 and/or components 315-318 may be maintained by frequency synthesizer 300 for generating the necessary TXIQ and RXIQ signals for the additional frequency bands.

In one embodiment, LB transmitter 301A includes a filter 303A, a mixer 304A, and an amplifier 305A. Filter 303A may be a low-pass (LP) filter that receives LB transmitting (LBTX) signals to be transmitted to a destination, where the LBTX signals may be provided from a baseband processor such as baseband processor 102. Mixer 301A (also referred to as an up-convert mixer or an LB up-convert mixer)) is configured to mix and modulate the LBTX signals onto a carrier frequency signal based on TXIQ signal provided by LB phase rotators 314. The modulated signals (e.g., low-band RF or LBRF signals) are then amplified by amplifier 305A and the amplified signals are then transmitted to a remote receiver via antenna 310A.

In one embodiment, LB receiver 302A includes an amplifier 306A, mixer 307A, and filter 308A. Amplifier 306A is to receive LBRF signals from a remote transmitter via antenna 310A and to amplify the received RF signals. The amplified RF signals are then demodulated by mixer 307A (also referred to as a down-convert mixer or an LB down-convert mixer) based on RXIQ signal received from LB phase rotators 314. The demodulated signals are then processed by filter 308A, which may be a low-pass filter. In one embodiment, LB transmitter 301A and LB receiver 302A share antenna 310A via a transmitting and receiving (T/R) switch 309A. T/R switch 309A is configured to switch between LB transmitter 301A and receiver 302A to couple antenna 310A to either LB transmitter 301A or LB receiver 302A at a particular point in time.

Similarly, HB transmitter 301B includes filter 303B, mixer 304B (also referred to as a HB up-convert mixer), and amplifier 305B having functionalities similar to filter 303A, mixer 304A, and amplifier 305A of LB transmitter 301A, respectively, for processing high-band transmitting (HBTX) signals. HB receiver 302B includes filter 306B, mixer 307B (also referred to as a HB down-convert mixer), and filter 308B having functionalities similar to amplifier 306A, mixer 307A, and filter 308A of LB receiver 302A, respectively, for processing high-band receiving (HBRX) signals. HB transmitter 301B and HB receiver 302B are coupled to antenna 310B via T/R switch 309B similar to the configuration of LB transmitter 301A and receiver 302A. Antenna 310A-310B may represent any one or more of antennas 221-223 of FIG. 2, which are not part of the RF frontend circuit.

Figure 4:
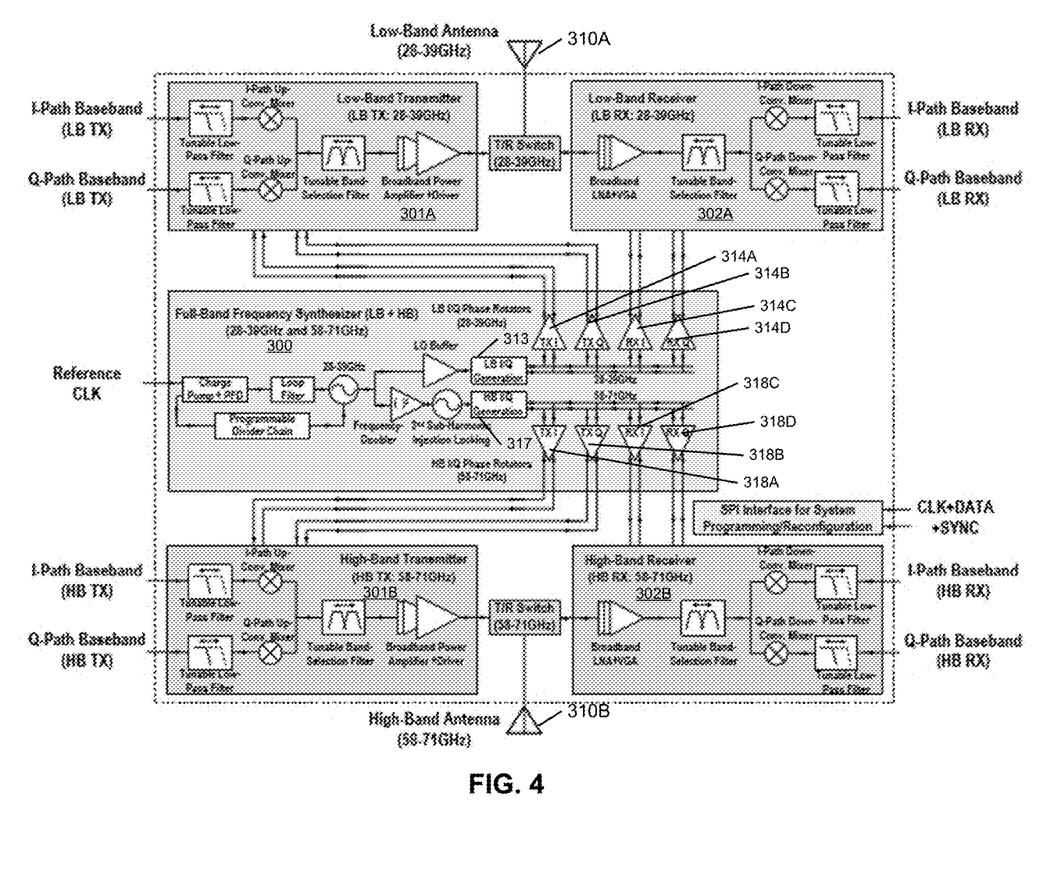
FIG. 4 is a block diagram illustrating an RF frontend integrated circuit according to another embodiment of the invention.

FIG. 4 is a block diagram illustrating an example of an RF frontend integrated circuit according to another embodiment of the invention. Referring to FIG. 4, in this embodiment, each of LB transmitter 301A, LB receiver 302A, HB transmitter 301B, and HB receiver 302B includes two paths: 1) I path for processing in-phase component signals and 2) Q-path for processing quadrature component signals. In one embodiment, LB transmitter 301A includes an I-path low-pass filter (e.g., a tunable low-pass filter) to receive I-path baseband signals and an I-path up-convert mixer to mix and modulate the I-path baseband signals. LB transmitter 301A includes a Q-path low pass filter (e.g., a tunable low-pass filter) to receive Q-path baseband signals and a Q-path up-convert mixer to mix and modulate the Q-path baseband signals. LB transmitter 301A further includes a tunable band selection filter and an amplifier. The band selection filter (e.g., a band-pass filter) is to select the corresponding frequency band to remove noises that are outside of the corresponding band. The amplifier is to amplify the modulated RF signals to be transmitted to a remote device via antenna 310A. HB transmitter 301B includes similar components as of LB transmitter 301A for processing signals in a higher frequency band.

Similarly, according to one embodiment, LB receiver 302A includes an amplifier (e.g., a low-noise amplifier or LNA) to receive LBRF signals from a remote device via antenna 310A and a band selection filter (e.g., a band-pass filter). LB receiver 302A further includes an I-path down-convert mixer and a Q-path down-convert mixer to mix and demodulate the RF signal into I-path baseband signals and Q-path baseband signals. LB receiver 302A further includes an I-path low-pass filter and a Q-path low-pass filter to processing the I-path baseband signals and the Q-path baseband signals, which can then be provided to the baseband processor. HB receiver 302B includes similar components as of LB receiver 302A for processing signals in a higher frequency band.

In one embodiment, frequency synthesizer 300 includes a PLL block having a charge pump with a phase frequency detector, a loop filter, a programmable divider, a voltage-controlled oscillator. The frequency synthesizer 300 further includes a frequency doubler and an injection locking oscillator as described above with respect to FIG. 3.

In addition, frequency synthesizer 300 includes in-phase transmitting (TXI) phase rotator 314A, quadrature transmitting (TXQ) phase rotator 314B, in-phase receiving (RXI) phase rotator 314C, and quadrature receiving (RXQ) phase rotator 314D, which are specifically configured to perform phase rotation to generate in-phase LO signals and quadrature LO signals for LB transmitter 301A and LB receiver 302A. Specifically, TXI phase rotator 314A is coupled to the I-path up-convert mixer of LB transmitter 301A and TXQ phase rotator 314B is coupled to the Q-path up-convert mixer of LB transmitter 301A to enable the I-path and Q-path baseband signals to be mixed and modulated within the corresponding frequency band. RXI phase rotator 314C is coupled to the I-path down-convert mixer of LB receiver 302A and RXQ phase rotator 314D is coupled to the Q-path down-convert mixer of LB receiver 302A to enable the I-path and Q-path baseband signals to be mixed and demodulated within the corresponding frequency band.

In one embodiment, frequency synthesizer 300 includes in-phase transmitting (TXI) phase rotator 318A, quadrature transmitting (TXQ) phase rotator 318B, in-phase receiving (RXI) phase rotator 318C, and quadrature receiving (RXQ) phase rotator 318D, which are specifically configured to perform phase rotation to generate in-phase LO signals and quadrature LO signals for HB transmitter 301B and HB receiver 302B. Specifically, TXI phase rotator 318A is coupled to the I-path up-convert mixer of HB transmitter 301B and TXQ phase rotator 318B is coupled to the Q-path up-convert mixer of HB transmitter 301B to enable the I-path and Q-path baseband signals to be mixed and modulated within the corresponding frequency band. RXI phase rotator 318C is coupled to the I-path down-convert mixer of HB receiver 302A and RXQ phase rotator 318D is coupled to the Q-path down-convert mixer of HB receiver 302B to enable the I-path and Q-path baseband signals to be mixed and demodulated within the corresponding frequency band.

Again, in this example as shown in FIG. 4, there are two frequency bands covered by the frequency synthesizer 300. However, more frequency bands may be implemented within the integrated RF frontend. If there are more frequency bands to be implemented, more sets of TXI, TXQ, RXI, and RXQ phase rotators may be required.

Figure 5A:
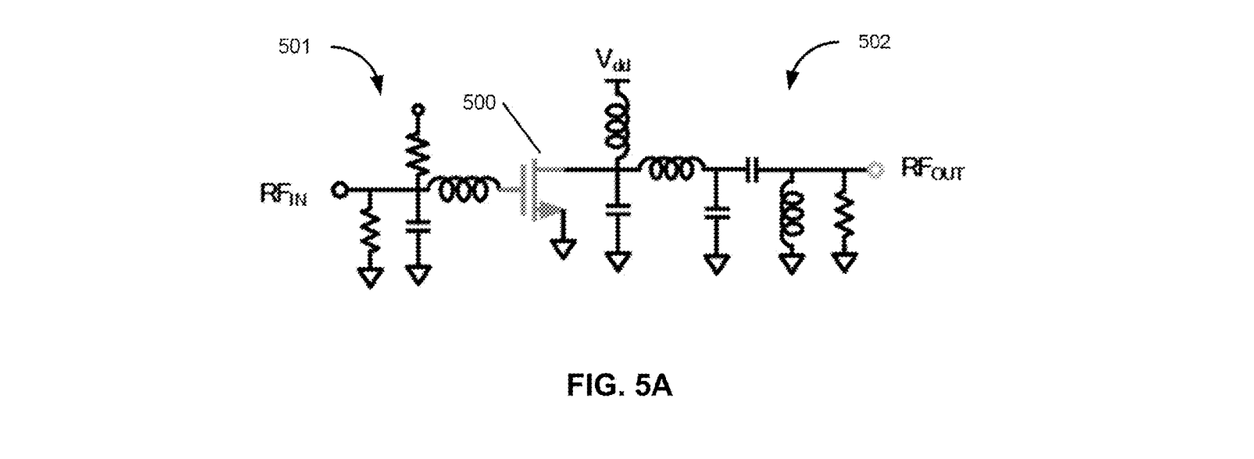
FIGS. 5A-5D are schematic diagrams illustrating examples of a power amplifier with transmission lines according to certain embodiments.

FIG. 5A is a schematic diagram illustrating an example of an amplifier equivalent circuit according to one embodiment of the invention. Referring to FIG. 5A, the amplifier circuit can be implemented as any of the power amplifiers as described above, such as, for example, amplifiers 305 and 306. In this example, a transistor 500 is utilized as an example of an amplifier. In addition, an input transmission line 501 is coupled to an input of transistor 500 such as a gate terminal. Further, an output transmission line 502 is coupled to an output of transistor 500 such as a drain terminal. The transmission lines 501 and 502 may be formed using metamaterial concept during fabrication of the IC device. In the 5G RF field, the power amplifier has to be able to provide relatively linear gain over a wideband of frequencies. Due to the high frequencies associated with the 5G technology, transmission lines 501-502 are formed as a part of implementation such as IC manufacturing processes. In this example, a single stage of amplifier is shown; however, multi-stage circuit can also be applicable.

In this example, the input transmission line circuit 501 includes an inductor-capacitor (LC) circuit (also referred to herein as a first LC circuit) having a resonant frequency dependent upon the inductance (L) and capacitance (C) values of the inductor and capacitor. Output transmission line circuit 502 includes an inductor-capacitor-inductor (LCL) circuit (also referred to herein as a second LC circuit) and a capacitor-inductor-capacitor (CLC) circuit (also referred to herein as a third LC circuit), resonating at a specific resonant frequency based on their respective LC values. The circuit as shown represents a single stage amplifier, transistor can be realized as common source or cascade RF in and out, Vdd as bias. The circuit as shown in FIG. 5A can be transformed via capacitive transformation or inductive transformation.

Figure 5B:
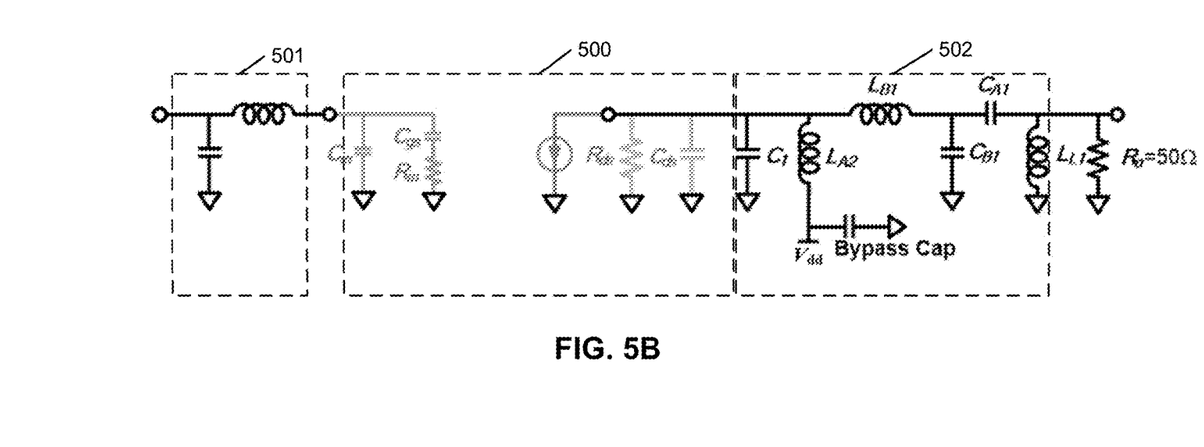

FIG. 5B shows an equivalent circuit model which models the circuit as shown in FIG. 5A via capacitive transformation. Referring to FIG. 5B, Rds is output resistance. For power amplifier design, large size of transistor (e.g., physical size) is selected for high output power delivered and therefore Rds needs to be small and Cds needs to be high. Once transistor size has been decided, based on Rds=R0/N, where N represents a transformation ratio and R0 is the target input/output matching impedance, N can be derived and determined.

In terms of voltage transformation, the transformation ratio is related to a ratio of the secondary voltage and the primary voltage, which may be determined based on the ratio between secondary turns and primary turns. In terms of current transformation, the transformation ratio is represented by a ratio the secondary current and the primary current, which may be determined based on the ratio between the primary turns and the secondary turns.

Figure 5C:
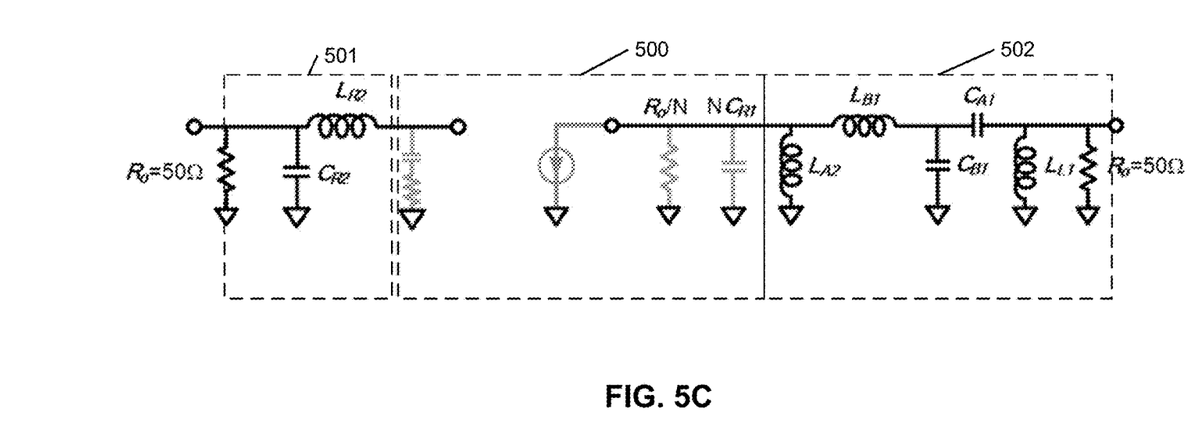

In one embodiment, R0 is approximately 50 ohm. Rearrange circuit combination for impedance transformation (e.g., capacitive transformation) is shown as dash box 505 in FIG. 5C, where $NC_{R1}=C_{ds}+C_1$. According to one embodiment, the transformation has to satisfy follow the equations:

$$N = \left(\frac{C_{A1} + C_{B1}}{C_{B1}}\right)^2, C_{L1} = C_{A1}\sqrt{N},$$

$$C_{R1} = C_{B1}\sqrt{N}, L_{L1} = L_{A1}N, L_{R1} = L_{B1}N$$

Figure 5D:
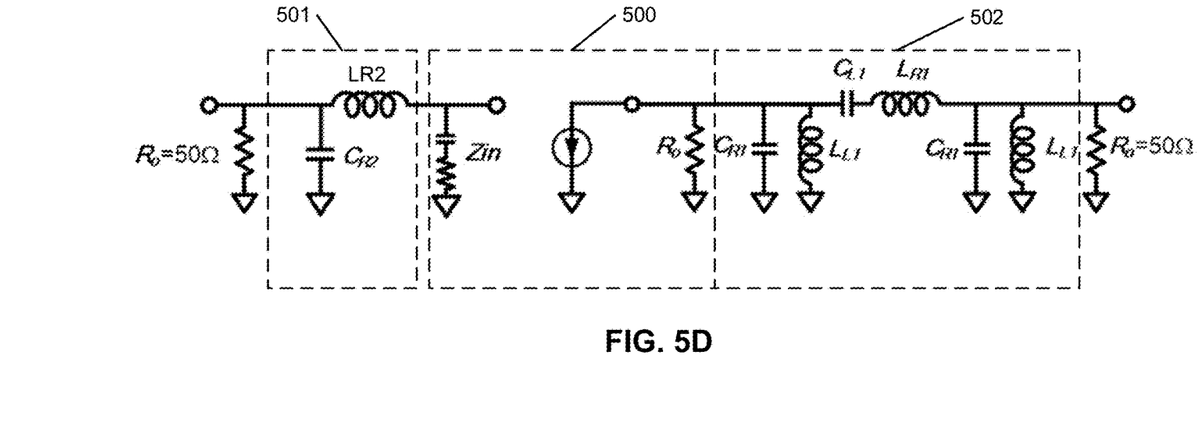

After transformation, two artificial transmission lines with active current source are achieved for wide band performance, as shown in FIG. 5D. Zin can add more shunt or series connected resistor to enhance stability, also improve the impedance close to 50 ohms.

All characteristic impedance artificial transmission lines should keep 50 ohm as:

$$Z_o \square \sqrt{\frac{L_{R2}}{C_{R2}}} \quad Z_o = \sqrt{\frac{L_{L1}}{C_{L1}}} \quad Z_o = \sqrt{\frac{L_{R1}}{C_{R1}}}$$

And pole should be as left-hand (LH) and right-hand (RH) frequencies:

$$f_c^{RH} \square \frac{1}{\pi\sqrt{L_{R2}C_{R2}}}, f_c^{RH} = \frac{1}{\pi\sqrt{L_{R1}C_{R1}}}, f_c^{LH} = \frac{1}{4\pi\sqrt{L_{L1}C_{L1}}}$$

Figure 6A:
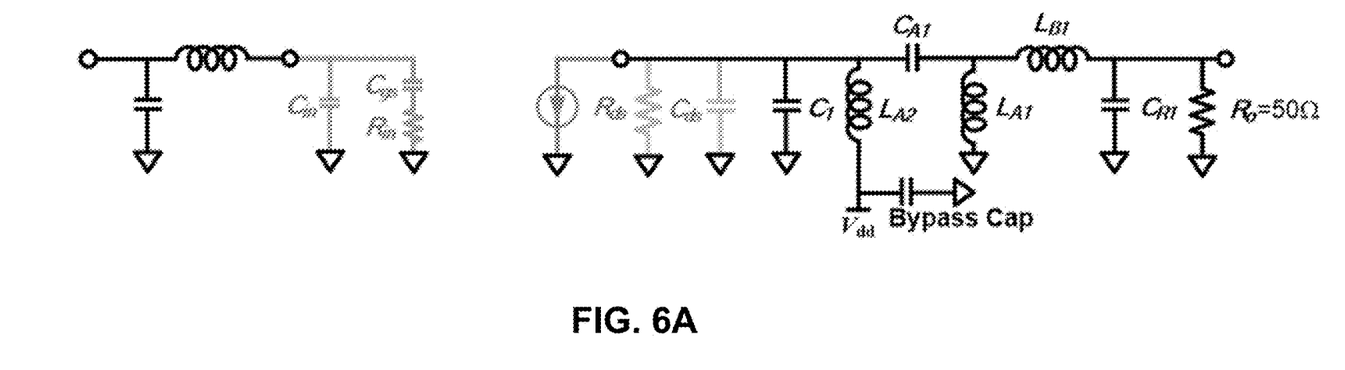
FIGS. 6A-6B are schematic diagrams illustrating examples of a power amplifier with transmission lines according to certain embodiments.
Figure 6B:
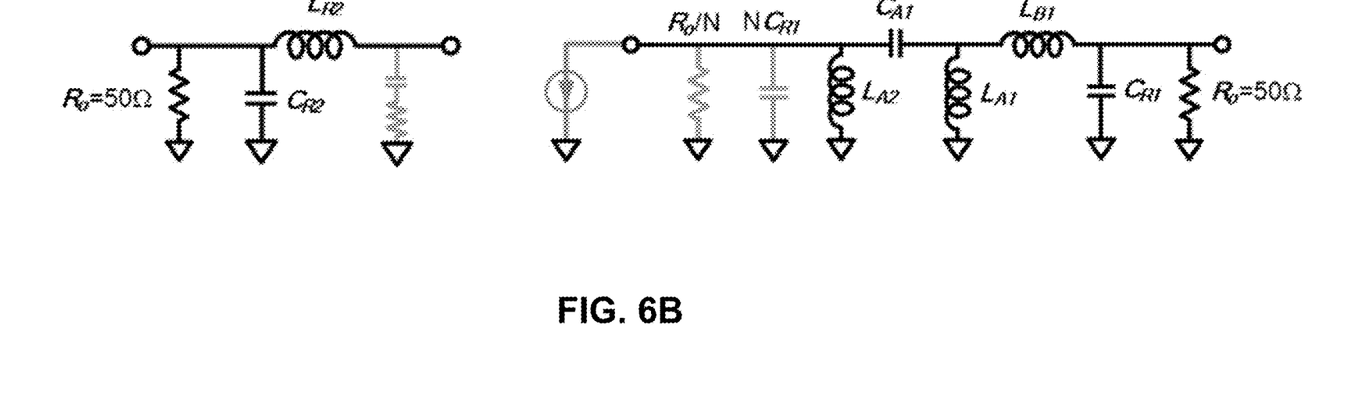

The above transformation is referred to as capacitive transformation. The transformation can also be illustrated in a form of inductive transformation, starting with FIG. 5A. The equivalent circuit can be transformed into the circuit as shown in FIG. 6A. Once the transistor size has been determined, Rds=R0/N, we can get N, where R0 is 50 ohm. Rearrange circuit combination for impedance transformation (gray dash line) and $NC_{R1}=C_{ds} C_1$. The equivalent circuit can be transformed into the circuit as shown in FIG. 6B. The transformation must follow the following equations:

$$N = \left(\frac{L_{A1}+L_{B1}}{L_{B1}}\right)^2, L_{L1} = L_{A1}\sqrt{N} = NL_{A2}, L_{R1} = L_{B1}\sqrt{N}, C_{L1} = \frac{C_{A1}}{N}$$

After transformation, two artificial transmission lines with active current source are achieved for wide band performance as shown in FIG. 5D.

Figure 7:
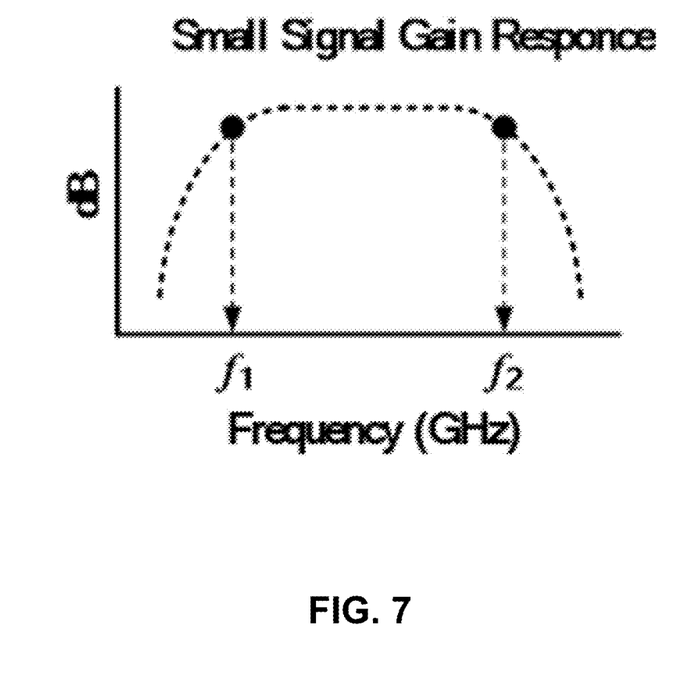
FIG. 7 shows a diagram illustrating a target gain curve of a power amplifier according to one embodiment.

One of the goals of the designed amplifier is to provide a relatively linear gain over a predetermined range of frequencies, for example, from lower frequency f1 to higher frequency f2 as shown in FIG. 7. In addition, the following conditions have to be satisfied in determining the parameters of the circuits as shown in FIG. 5D:

$$f_c^{LH} = \frac{1}{2\pi\sqrt{L_{L1}C_{L1}}} \leq f_1$$

$$f_c^{RH} = \min\left\{\frac{1}{2\pi\sqrt{L_{R1}C_{R1}}}, \frac{1}{2\pi\sqrt{L_{R2}C_{R2}}}\right\} \geq f_2$$

In the embodiment as shown in FIG. 5D, $L_{R2}$ and $C_{R2}$ form an LC circuit (e.g., a first LC circuit) on the input transmission line, where $C_{R2}$ is coupled to the input of the transistor 500 in parallel while $L_{R2}$ is coupled in series. On the output side, a $L_{R1}$ and two capacitors ($C_{R1}$) form a CLC circuit (e.g., a third LC circuit). Two inductors ($L_{L1}$) and a capacitor $C_{L1}$ form an LCL circuit (e.g., a second LC circuit). The LCL and CLC circuits are almost in a parallel configuration, except that $C_{L1}$ and $L_{R1}$ are coupled in series.

In this embodiment, $C_{L1}$ and $L_{R1}$ are coupled in series. A first pair of $C_{R1}$ and $L_{L1}$ is coupled in parallel to each other and coupled to an input end of $C_{L1}$ and $L_{R1}$ in series. A second pair of $C_{R1}$ and $L_{L1}$ is coupled in parallel to each other and coupled to an output end of $C_{L1}$ and $L_{R1}$ in series.

In one embodiment, the inductance and capacitance values of these LCL and CLC circuits have to satisfy the conditions set forth above. For example, the parameters of the LC components are configured to satisfy the target range of operating frequencies, i.e., from $f_1$ to $f_2$. The values of $L_{L1}$ and $C_{L1}$ components on the output transmission line 502 are configured, such that the resonant frequency of the LCL circuit on $L_1$ has to be equal to or less than the lower bound target frequency $f_1$. The values of $L_{R1}$ and $C_{R1}$ components on the output transmission line 502 are configured, such that the resonant frequency of the CLC circuit on $R_1$ has to be equal to or higher than the upper bound target frequency $f_2$. The values of $L_{R2}$ and $C_{R2}$ components on the output transmission line 502 are configured, such that the resonant frequency of the LCL circuit on $R_2$ has to be equal to or higher than the upper bound target frequency $f_2$.

The above techniques have been described using a single-ended amplifier as an example. According to another aspect of the invention, the techniques described above can also be applicable to a differential power amplifier. A differential amplifier is a type of electronic amplifier that amplifies the difference between two input voltages but suppresses any voltage common to the two inputs. It is an analog circuit with two inputs and one output in which the output is ideally proportional to the difference between the two inputs.

Figure 8A:
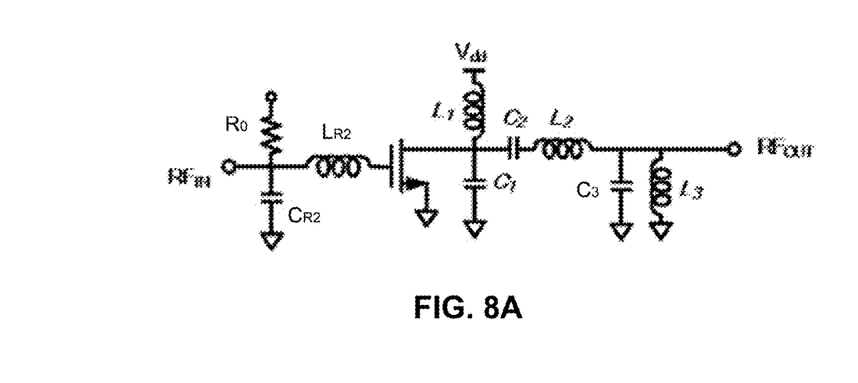
FIGS. 8A-8D are schematic diagrams illustrating examples of a differential power amplifier with transmission lines according to certain embodiments.
Figure 8B:
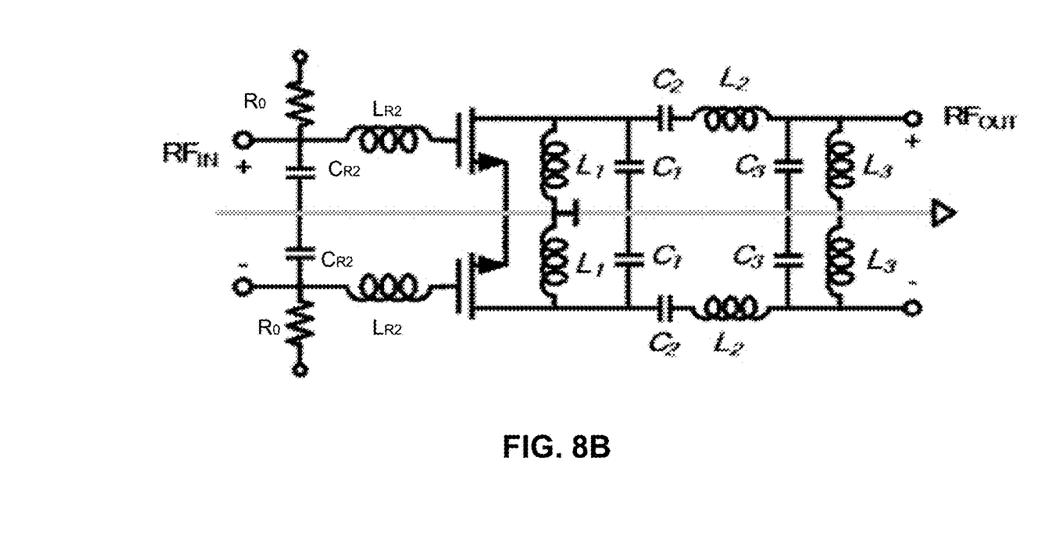

Referring now to FIG. 8A, which is a single-ended amplifier similar to the one as shown in FIG. 5D. In this example, the output transmission line includes $C_1$, $C_2$, $C_3$, $L_1$, $L_2$, and $L_3$, which correspond to $C_{R1}$, $C_{L1}$, $C_{R1}$, $L_{L1}$, $L_{R1}$, and $L_{L1}$ of FIG. 5D, respectively. A differential version of the circuit can be converted by mirroring an identical circuit with a virtual ground as shown in FIG. 8B.

In order to form a true differential amplifier, a transformer is required between the transistors and the output transmission line. Due to the nature of the transformer operating in a higher switching frequency, the inductance of the circuit, as well as the associated resonant frequency may be affected. As a result, a portion of $L_2$ may be implemented as a part of transformer design or model.

Figure 8C:
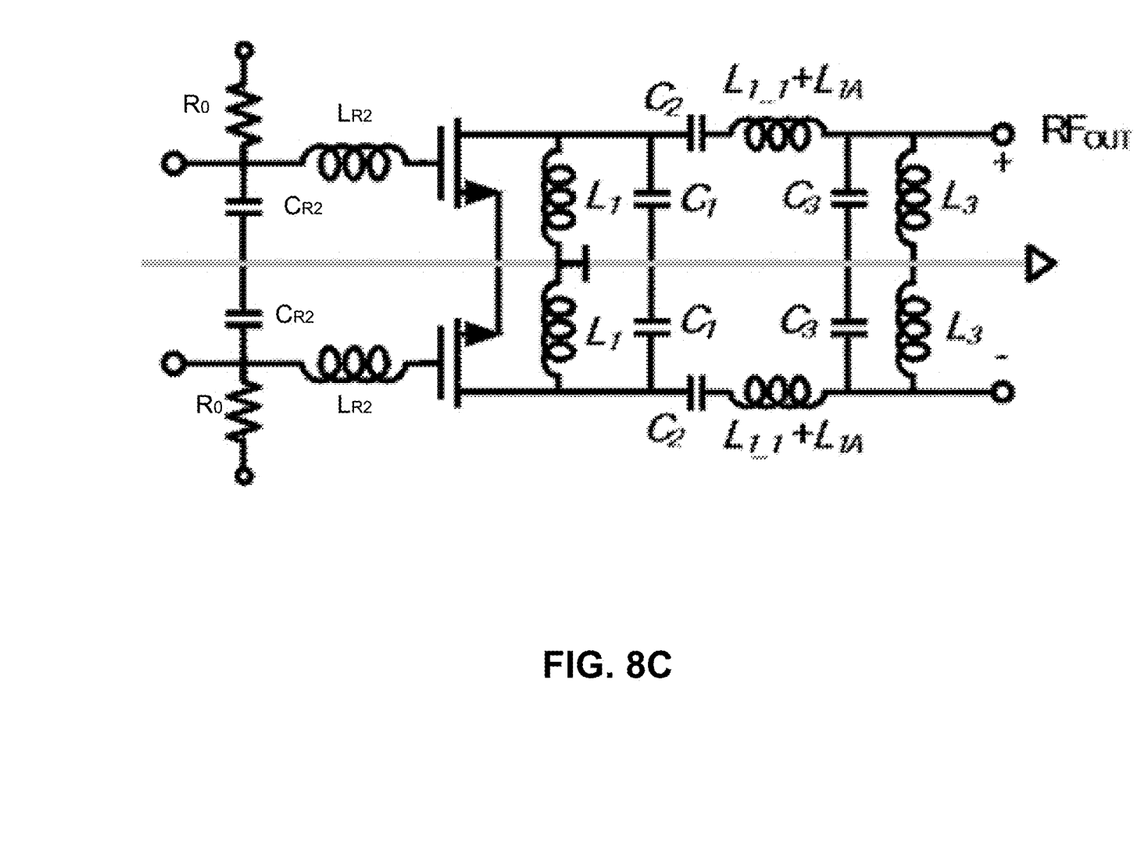
Figure 8D:
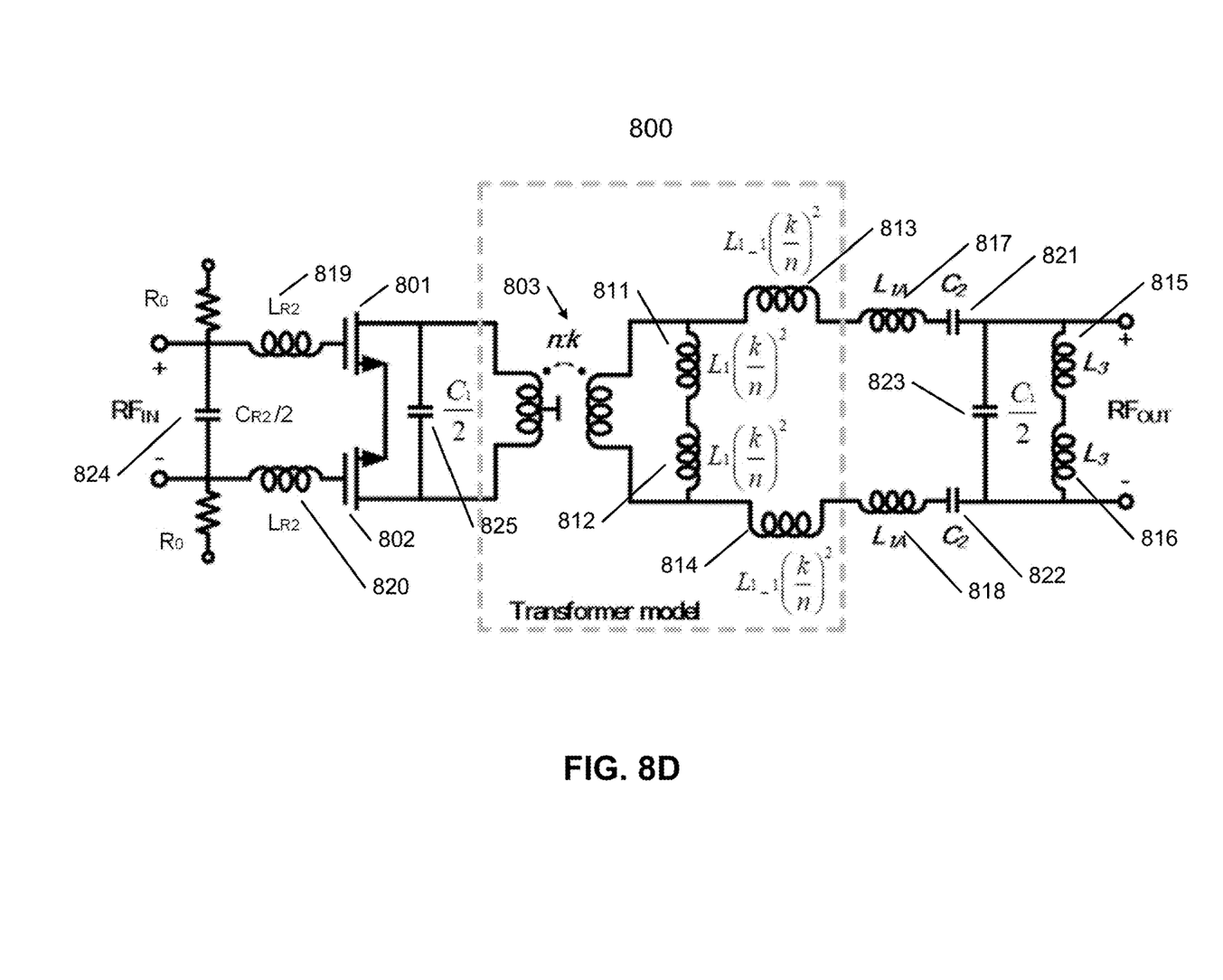

For a given transformer with a turn ratio (n) and a coupling coefficient (k), where n refers to a turn ratio between a number of turns in a secondary winding and a number of turns in a primary winding of the transformer, $L_2$ is divided into $L_{1\_1}$ and $L_{A1}$, as shown in FIG. 8C. $L_{1\_1}$ is a part of the transformer model, which is shown in FIG. 8D. In one embodiment, $L_{1\_1}$ can be derived from the following formula:

$$\frac{L_{1\_1}}{L_1} = \frac{1-k^2}{k^2}$$

Referring now to FIG. 8D, according to one embodiment, the differential power amplifier 800 includes a pair of first transistor 801 and second transistor 802 coupled to each other via their respective source terminals. Amplifier 800 further includes a transformer 803 coupled to transistors 801-802 and an output transmission line. Transformer 803 includes a primary winding coupled to the drain terminals of transistors 801-802. The secondary winding of transformer 803 is coupled to the output transmission line. The transformer 803 is configured to have a turn ratio (n) representing a turn ratio between the turns of the secondary winding and the primary winding, where the transformer 803 is configured to have a coupling coefficient (k).

In one embodiment, the transmission line includes a first inductor 811 and a second inductor 812 coupled in series and then to the terminals of the secondary winding of transformer 803. In this example, first inductor 811 and second inductor 812 both have identical inductance of $L_1$. The output transmission line further includes a third inductor 813 coupled to a first terminal of the secondary winding of transformer 803 and a fourth inductor 814 coupled to a second terminal of the secondary winding of transformer 803. The third and fourth inductors 813-814 both have inductance of $L_{1\_1}$. The output transmission line further includes a first capacitor 821 coupled to the third inductor 813 and a first output terminal of the amplifier 800 in series. The output transmission line further includes a second capacitor 822 coupled to the fourth inductor 814 and a second output terminal of amplifier 800 in series. Both capacitors 821-822 have capacitance of $C_2$.

In one embodiment, the output transmission line further includes a fifth inductor 815 and a sixth inductor 816 coupled in series and then coupled to the first and second output terminals of the amplifier 800. Both fifth and sixth inductors 815-816 have inductance of $L_3$. In one embodiment, the output transmission line further includes a seventh inductor 817 coupled between third inductor 813 and first capacitor 821 in series. The output transmission line further includes an eighth inductor 818 coupled between fourth inductor 814 and second capacitor 822 in series. Both seventh and eighth inductors 817-818 have inductance of $L_{1A}$. The amplifier 800 further includes fifth capacitor 825 coupled to the primary winding of transformer 803 (e.g., drain terminals of transistors 801-802). The source terminals of transistors 801-802 are coupled to each other.

According to one embodiment, amplifier 800 further includes an input transmission line. The input transmission line includes a ninth inductor 819 coupled to the gate terminal of first transistor 801 and a first input terminal of amplifier 800. Both ninth and tenth inductors 819-820 have inductance of $L_{R2}$. The input transmission line further includes a tenth inductor 820 coupled the gate terminal of second transistor 802 and a second input terminal of amplifier 800. The input transmission line further includes a fourth capacitor 824 coupled to the first and second input terminals of the amplifier 800. Fourth capacitor 824 has capacitance of $C_{R2}/2$.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A differential power amplifier used in a wideband radio frequency (RF) circuit implemented in an integrated circuit (IC), the power amplifier comprising:
   a pair of a first transistor and a second transistor coupled to each other to form a differential amplifier that operates in a range of frequencies from a lower operating frequency ($f_1$) to an upper operating frequency ($f_2$) to provide a relatively linear gain between the lower operating frequency and the upper operating frequency;
   a transformer having a primary winding and a secondary winding with a turn ratio (n) and a coupling coefficient (k), wherein the primary winding is coupled to a first drain terminal of the first transistor and a second drain terminal of the second transistor; and
   an output metamaterial transmission line coupled to the secondary winding of the transformer, wherein the output metamaterial transmission line comprises:
      a first inductor and a second inductor having an identical inductance ($L_1$) coupled in series to a first terminal and a second terminal of the secondary winding of the transformer,
      a third inductor coupled to the first terminal of the secondary winding of the transformer, wherein the second inductor is configured to have an inductance ($L_{1\_1}$) that is determined based on $L_1$, n, and k,
      a first capacitor coupled to the third inductor in series and a first output terminal of the differential power amplifier, the first capacitor having a capacitance of $C_2$,
      a fourth inductor coupled to the second terminal of the secondary winding of the transformer, wherein the fourth inductor is configured to have an inductance ($L_{1\_1}$) that is determined based on $L_1$, n, and k, and
      a second capacitor coupled to the fourth inductor in series and a second output terminal of the differential power amplifier, the second capacitor having a capacitance of $C_2$.

2. The power amplifier of claim 1, wherein the inductance ($L_{1\_1}$) of the third inductor is determined based on: $L_{1\_1} = ((1-k^2)*L_1)/k^2$.

3. The power amplifier of claim 1, wherein the inductance ($L_{1\_1}$) of the fourth inductor is determined based on: $L_{1\_1} = ((1-k^2)*L_1)/k^2$.

4. The power amplifier of claim 1, wherein output impedance ($Z_0$) across the first and second output terminals is determined based on: $Z_0 = SQRT(L_1/C_2)$.

5. The power amplifier of claim 1, wherein the output metamaterial transmission line further comprises a third capacitor coupled to the first and second output terminals of the differential power amplifier, wherein the third capacitor has a capacitance of $C_1/2$.

6. The power amplifier of claim 5, further comprising a fifth inductor and a sixth inductor having an identical inductance ($L_3$) coupled in series and then to the first and second output terminals of the differential power amplifier.

7. The power amplifier of claim 6, wherein output impedance ($Z_0$) across the first and second output terminals is determined based on: $Z_0 = SQRT(L_3/C_2)$.

8. The power amplifier of claim 6, further comprising:
   a seventh inductor having an inductance of $L_{1A}$ coupled in series between the second inductor and the first capacitor; and
   an eighth inductor having an inductance of $L_{1A}$ coupled in series between the third inductor and the second capacitor.

9. The power amplifier of claim 8, wherein output impedance ($Z_0$) across the first and second output terminals is determined based on: $Z_0 = SQRT((L_{1\_1}+L_1)/C_1)$.

10. The power amplifier of claim 8, wherein the upper operating frequency $f_2 <= 1/(2*PI*SQRT((L_{1\_1}+L_{1A})*C_1))$.

11. The power amplifier of claim 1, wherein the lower operating frequency $f_1 >= 1/(2*PI*SQRT(L_1*C_2))$.

12. The power amplifier of claim 1, further comprising an input metamaterial transmission line coupled to a first gate terminal of the first transistor and a second gate terminal of the second transistor.

13. The power amplifier of claim 12, wherein the input metamaterial transmission line comprises:
   a ninth inductor having an inductance of $L_{R2}$ coupled between the first gate terminal of the first transistor and a first input terminal of the differential power amplifier;
   a tenth inductor having an inductance of $L_{R2}$ coupled between the second gate terminal of the first transistor and a second input terminal of the differential power amplifier; and
   a fourth capacitor having a capacitance of $C_{R2}/2$ coupled to the first and second input terminals.

14. The power amplifier of claim 13, wherein the upper operating frequency $f_2 <= 1/(2*PI*SQRT(L_{R2}*C_{R2}))$.

15. The power amplifier of claim 1, further comprising a fifth capacitor having a capacitance value of $C_1/2$ across the primary winding of the transformer.

16. The power amplifier of claim 1, wherein a first source terminal of the first transistor is coupled to a second source terminal of the second transistor.

\* \* \* \* \*